United States Patent [19]

Huynh et al.

[11] Patent Number: 5,896,870
[45] Date of Patent: Apr. 27, 1999

[54] METHOD OF REMOVING SLURRY PARTICLES

[75] Inventors: Cuc K. Huynh, Jericho; Harold G. Linde, Richmond; Patricia E. Marmillion, Colchester; Anthony M. Palagonia, Underhill; Bernadette A. Pierson, South Hero; Matthew J. Rutten, Milton, all of Vt.

[73] Assignee: International Business Machines Corporation, Armonk, N.Y.

[21] Appl. No.: 08/814,675

[22] Filed: Mar. 11, 1997

[51] Int. Cl.$^6$ .............. H01L 21/302; B08B 6/00
[52] U.S. Cl. .............. 134/1.3; 216/89; 438/693
[58] Field of Search .............. 216/89; 438/693; 134/1.3

[56] References Cited

U.S. PATENT DOCUMENTS

| | | | |
|---|---|---|---|
| 3,728,154 | 4/1973 | Suzuki | 134/3 |
| 4,050,954 | 9/1977 | Basi | 134/2 |
| 4,932,168 | 6/1990 | Tada et al. | 51/436 |
| 4,968,381 | 11/1990 | Prigge et al. | 156/636 |
| 5,176,756 | 1/1993 | Nakashima et al. | 134/2 |
| 5,320,706 | 6/1994 | Blackwell | 156/636 |
| 5,389,194 | 2/1995 | Rostoker et al. | 156/636 |
| 5,391,511 | 2/1995 | Doan et al. | 437/49 |
| 5,456,758 | 10/1995 | Menon | 134/33 |
| 5,478,436 | 12/1995 | Winebarger et al. | 156/636.1 |

FOREIGN PATENT DOCUMENTS 4-158613  6/1992  Japan.

*Primary Examiner*—Benjamin Utech
*Assistant Examiner*—George Goudreau
*Attorney, Agent, or Firm*—Schmeiser, Olsen & Watts; Howard J. Walter, Jr.

[57] ABSTRACT

Disclosed is a method and apparatus for polishing a semiconductor wafer. This invention describes a novel in situ method for eliminating residual slurry and slurry abrasive particles on the wafer. A reactant is added to the slurry during the end of the Chemical Mechanical Polish (CMP) process to dissolve the slurry and etch the abrasive particles.

27 Claims, 1 Drawing Sheet

5,896,870

METHOD OF REMOVING SLURRY PARTICLES

BACKGROUND OF THE INVENTION

1. Technical Field

The present invention relates generally to semiconductor wafers and more particularly the invention pertains to the field of Chemical Mechanical Polish (CMP) used during the fabrication of semiconductor chips to planarize the wafers.

2. Background Art

Rapid progress in semiconductor device integration demands smaller and smaller wiring patterns or interconnections which connect active areas. As a result, the tolerances regarding the planeness or flatness of the semiconductor wafers used in these processes are becoming smaller and smaller. One customary way of flattening the surfaces of semiconductor wafers is to polish them with a polishing apparatus.

Such a polishing apparatus has a rotating wafer carrier assembly in contact with a polishing pad. The polishing pad is mounted on a rotating turntable which is driven by an external driving force. The polishing apparatus causes a polishing or rubbing movement between the surface of each thin semiconductor wafer and the polishing pad while dispersing a polishing slurry to obtain a chemical mechanical polish (CMP). CMP in planarization requires the wafer surface to be brought into contact with a rotating pad saturated with either a slurry of abrasive particles or a reactive solution, or both, that attacks the wafer surface. This is done while exerting force between the wafer and polishing pad. The abrasive particles can scratch the surface during the polish operation especially if they agglomerate. Also, after polishing is completed and the wafer is rinsed to remove the abrasive particles, some of the abrasive particles will remain on the wafer surface by simply being imbedded into the surface or strongly attracted to the surface.

The scratches can cause problems in subsequent processing steps as for example in a Damascene process, intra-level where shorting could result. Leaving the particles on the wafer can likewise lead to process problems, most notably photolithographic and etching defects in subsequently processed levels.

Prior art for particle removal involves either a mechanical clean, such as a brush clean, after the wafers have been removed from the polishing apparatus and dried, or a washing step with a surfactant (soap) performed prior to the wafer being dried as disclosed in U.S. Pat. No. 5,320,706, issued to Blackwell on Jun. 14, 1994 and assigned to Texas Instruments Incorporated. These processes are not usually 100% effective and do not address the scratching problem. Therefore, it appears that no prior art per se exists that addresses the scratching problem directly.

SUMMARY OF THE INVENTION

The present invention discloses a method and apparatus for removing slurry abrasive particles in a polishing process for planarization of a semiconductor wafer.

The present invention discloses a method and apparatus for reducing the size of the slurry abrasive particles or agglomerations of slurry abrasive particles in a polishing process for planarization of a semiconductor wafer.

The present invention discloses a method for in situ reduction in size of abrasive particles in a slurry during a polishing process for planarization of a wafer comprising: exposing the slurry to a reagent to reduce the size of the slurry abrasive particles.

The present invention disclose a method for in situ reduction in size of agglomerations of abrasive particles in a slurry during a polishing process for planarization of a wafer, comprising: exposing the slurry to a reagent to reduce the size of the agglomerations of abrasive particles.

The present invention is a method for in situ removal of abrasive particles in a slurry during a polishing process for planarization of a wafer, comprising: exposing the slurry to a reagent to dissolve the abrasive particles.

The present invention discloses a method for in situ reduction in size of abrasive particles in a slurry during a polishing process for planarization of a wafer, comprising: placing the wafer against a rotating polishing pad; applying the slurry to the polishing pad; and applying a reagent to the pad to reduce the abrasive particle size.

The present invention discloses a method for in situ reduction in size of abrasive particles in a slurry during a polishing process for planarization of a wafer, comprising: dispensing a CMP slurry; planarizing a semiconductor thin film using the slurry; reducing the slurry dispense; dispensing a reagent for a predetermined time necessary to reduce the abrasive particle size and agglomerations; and rinsing with DI (de-ionized) water.

The present invention discloses an apparatus comprising: a wafer; a polishing pad which planarizes the wafer; a slurry dispenser which provides slurry containing abrasive particles to the polishing pad; and a reagent dispenser which controllably provides reagent to the polishing pad.

In accordance with the above, it is an advantage of the present invention to solve the problem of slurry abrasive particle removal post-CMP and the problem of scratches on the post-CMP surface.

It is an advantage of the present invention to remove the abrasive particles in situ.

It is an advantage of the present invention to gradually reduce the abrasive particle size in situ.

It is an advantage of the present invention to gradually reduce the size of agglomerations of abrasive particles in situ.

It is an advantage of the present invention to eliminate residual slurry and slurry abrasives on the wafer. It is an advantage of the present invention to break up or reduce the size of abrasive particle agglomerations.

It is an advantage of the present advantage to dissolve the slurry abrasive particles at the CMP tool rather than removal at a subsequent tool.

It is an advantage of the present invention to eliminate slurry abrasive particle residues and reduce if not eliminate scratches.

It is an advantage of the present invention to obviate the need to remove slurry abrasive particles, since the slurry abrasive particles have been destroyed.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the quantities of constituting components, the materials thereof, the shapes thereof, the relative arrangement thereof, etc., and are disclosed simply as an example of the embodiment.

The invention is a method and apparatus to eliminate residual slurry abrasive particle formation on the wafer by adding a reagent, during the CMP process, to the slurry to etch the abrasive particles and agglomerations. (Agglomerations are a substantial grouping of abrasive particles).

Figure 1:
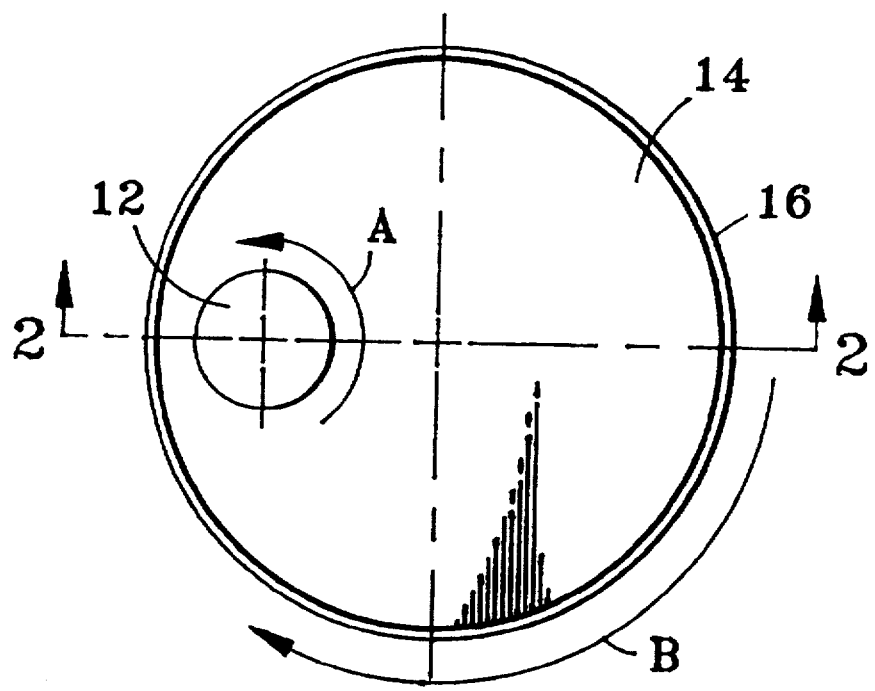
FIG. 1 depicts a top view of a polishing table.
Figure 2:
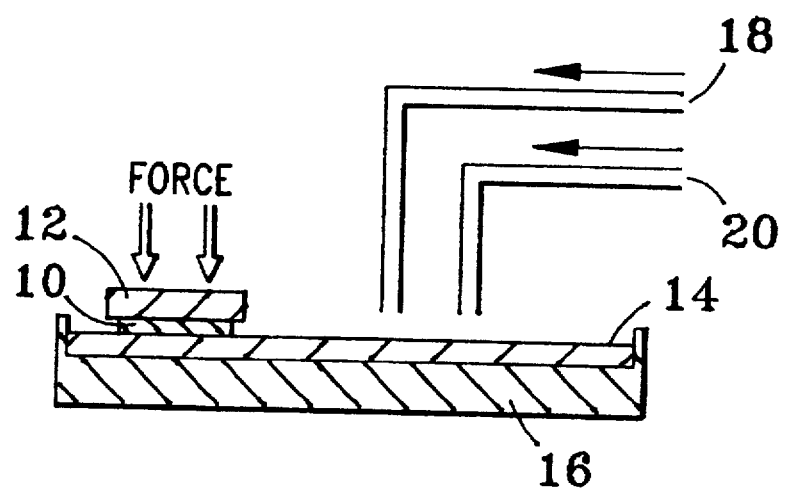
FIG. 2 depicts a side view of the polishing table showing the in situ distribution of the reagent.

FIG. 1 shows a top view of a polishing station and FIG. 2 shows a side view of the polishing table showing the in situ dispersement of the reagent. The drawings are simply illustrative of the invention and not a preferred design. This invention is applicable without regard to other motions applied to the wafer, though it is recognized that specific designs would require individual optimization of this process. FIGS. 1 and 2 show a semiconductor wafer 10 being held against polishing pad 14 and rotated in direction A by a rotating wafer carrier 12. A force is applied to the wafer 10 through the wafer carrier 12. The polishing pad 14 is held against the wafer 10 by a rotating support 16 which turns the pad 14 in the direction B. A polishing slurry containing abrasive particles may be dispersed through a tube 18. A reagent will be applied through tube 20 towards the end of the CMP process.

After completion of the planarization step, residual slurry abrasive particles remain on the wafer surface. The present invention will result in the reduction in the size of agglomerations, the reduction in the size of the abrasive particles, or a combination of both. The present invention could also result in no residual particles remaining after completion of the polishing step. Extension of the same concept used to eliminate the residual particles can be applied to reduce if not eliminate scratching of the surface due to embedded particles.

The solution of the present invention is to select an abrasive material and a reagent for the abrasive material in view of the surface material (and underlying materials that will be exposed) to be polished such that introduction of the reagent to the slurry for a predetermined time and at a predetermined, controlled rate, while the wafer is still in contact with the rotating polishing pad (in situ) to dissolve or reduce the size of the agglomerations of the abrasive particles without effecting the surface and other exposed structures. FIG. 2 shows the reactant to be dispersed in situ through the tube 20.

While in a preferred form of the invention the reagent used is chosen such that it reduces the size of the abrasive particles and/or agglomerations of abrasive particles and not the wafer surface, some etching of the wafer surface can be allowed provided not too much surface is removed. This would even be useful for removing abrasive particles and agglomerations of abrasive particles that have become embedded in the wafer surface. It should be understood that while the preferred embodiments utilize a reagent to reduce slurry particle size any technique that results in a reduction in size of abrasive particles, such as dissolution of the abrasive particles is envisioned by the invention. It is understood that the abrasive particles are substantially stable in the slurry carrier liquid and do not spontaneously reduce in size.

In the simple case of removal of slurry abrasive particles, several processes can be envisioned. The reagent can be introduced directly after endpoint is determined, or the wafer can be moved to another station of the same tool and before it dries out, polishing again started with the reagent material now introduced.

In the case where the process is to be used to reduce scratching, the reagent would be introduced for a predetermined time at a slow rate and in a dilution that would result in a slow reduction in size of the abrasive particles until they were totally dissolved. This would further enhance polishing as any chemical agent utilized in the chemical mechanical polishing process could also be neutralized at the same time. Thus grit size would be reduced slowly over time, resulting in a more highly polished surface.

Therefore an advantage of the present invention is that it can totally remove the particles, reduce their sizes, or merely reduce the size of agglomerations of the particles.

A first example of the present invention uses a slurry comprising potassium hydroxide (KOH) or ammonium hydroxide ($NH_4OH$) which contains cerium oxide ($CeO_2$) abrasive particles for polishing silicon dioxide. Near the end of the polish cycle a reagent comprising a small amount of nitric acid ($HNO_3$) or sulfuric acid ($H_2SO_4$) is added to the slurry or applied to the polishing pad, to first acidify the slurry and then to reduce the size or dissolve the cerium oxide abrasive particles (or agglomerations of abrasive particles). This would reduce the abrasive particle size and produce a smooth wafer surface and if the particles are completely dissolved, eliminate the need for special abrasive particle removal cleans. The nitric acid will not attack the silicon dioxide wafer surface, nor any exposed metal such as tungsten, but would attack exposed aluminum or copper metals. Thus this process could not be used if copper or aluminum were exposed on the wafer surface.

A second example of the present invention uses a slurry comprising silica abrasive particles for polishing silicon dioxide. Near the end of the polish cycle a reagent comprising a quantity of aqueous KOH, alcoholic KOH (using t-butanol or another alcohol), or aqueous tetramethylammonium hydroxide (TMAH) reagent is used to reduce the size or dissolve the silica abrasive particles (or agglomerations of abrasive particles). The KOH or TMAH will attack the silicon dioxide wafer surface at the same rate as the abrasive particles; therefore, this process would be most useful when the oxide thickness is much larger than the particle size. For example, a 30% by weight aqueous KOH solution at 85 degrees Celsius will etch $SiO_2$ at a rate of approximately 100 angstroms per minute; therefore, the particle will get smaller while the surface will be thinned by approximately 100 angstroms per minute due to chemical action alone. The KOH or TMAH will not attack any exposed metal such as tungsten or copper, but it will attack exposed aluminum. Therefore, this process could not be used if aluminum was exposed on the wafer surface.

A third example of the present invention uses a slurry comprising silicon abrasive particles for polishing silicon dioxide. Near the end of the polish cycle a reagent comprising a quantity of aqueous KOH, alcoholic KOH (using t-butanol or other alcohol), or aqueous tetramethylammonium hydroxide (TMAH) reagent is used to reduce the size or dissolve the silicon abrasive particles (or agglomerations of abrasive particles). The KOH or TMAH will attack the silicon abrasive particles at a much greater rate than the silicon dioxide wafer surface; therefore, this process would be most useful when the oxide thickness is thin. For example, a 30% by weight aqueous KOH solution at 85 degrees Celsius will etch silicon at a rate of approximately 3000–4000 angstroms per minute. As stated with regard to the second example, the KOH or TMAH will not attack any exposed metal such as tungsten or copper, but it will attack exposed aluminum. Therefore, this process could not be used if aluminum was exposed on the wafer surface.

A fourth example of the present invention uses a slurry comprising alumina ($Al_2O_3$) abrasive particles for polishing a tungsten surface. Near the end of the polish cycle a reagent comprising a quantity of a mixture of 200 parts by volume methanol ($CH_3OH$), 6 parts by volume hydrochloric acid (HCl), and 1 part by volume hydrofluoric acid (HF) is added to the slurry to reduce the size or dissolve the alumina abrasive particles (or agglomerations of abrasive particles). This mixture will not attack the tungsten and would be useful in a process for polishing the surface of a thin tungsten film, stopping in the middle of the film.

A fifth example of the present invention uses a slurry comprising tungsten (W) abrasive particles for polishing a silicon dioxide or silicon surface. Near the end of the polish cycle a reagent comprising a quantity of aqueous sodium hypochlorite (NaClO) is added to reduce the size or dissolve the tungsten abrasive particles (or agglomerations of particles).

A sixth example of the present invention uses a slurry comprising alumina ($Al_2O_3$) abrasive particles for polishing a $SiO_2$ surface. Near the end of the polish cycle a reagent comprising a quantity of phosphoric acid ($H_3PO_4$) is added to reduce the size or dissolve the alumina abrasive particles (or agglomerations of particles). This mixture will not attack the tungsten and would be useful for polishing the surface of $SiO_2$ having exposed tungsten metal.

Many examples of abrasive particles and reagent combinations can be used and only a few of the possible combinations are listed.

In summary, the steps to obtain the in situ removal of the slurry abrasive particles during a polishing process include dispensing a CMP slurry, planarizing a semiconductor thin film using the slurry, reducing the slurry dispense, dispensing a reagent for a predetermined time necessary to remove or reduce the size of slurry abrasive particles and agglomerations of slurry abrasive particles, and rinsing with De-Ionized (DI) water. The application of the reagent is controlled to controllably reduce the size of the slurry abrasive particles.

What is claimed is:

1. A method for in situ reduction in size of abrasive particles in a slurry during a polishing process for planarization of a wafer, comprising:

adding a reagent to the slurry during the polishing process to reduce the size of the abrasive particles.

2. The method of claim 1, wherein the abrasive particles comprise cerium oxide and the reagent comprises nitric acid.

3. The method of claim 1, wherein the abrasive particles comprise silica, silicon, alumina, or tungsten.

4. The method of claim 1, wherein the abrasive particles comprise silica or silicon and the reagent is selected from the group consisting of aqueous KOH, alcoholic KOH, and aqueous TMAH.

5. The method of claim 1, wherein the abrasive particles comprise alumina and the reagent comprises a mixture of methanol, hydrochloric acid, and hydrofluoric acid.

6. The method of claim 1, wherein the abrasive particles comprises a tungsten and the reagent comprises a sodium hypochlorite.

7. The method of claim 1, wherein the abrasive particles comprise an alumina and the reagent comprises a phosphoric acid.

8. A method for in situ reduction in size of agglomerations of abrasive particles in a slurry during a polishing process for planarization of a wafer, comprising:

adding a reagent to the slurry during the polishing process to reduce the size of the agglomerations of abrasive particles.

9. A method for in situ removal of abrasive particles in a slurry during a polishing process for planarization of a wafer, comprising:

exposing the slurry to a reagent during the polishing process to dissolve the abrasive particles.

10. A method for in situ reduction in size of abrasive particles in a slurry during a polishing process for planarization of a wafer, comprising:

placing the wafer against a rotating polishing pad;

applying the slurry to the polishing pad; and applying a reagent to one of the slurry and the pad during the polishing process to reduce the abrasive particle size.

11. The method of claim 10, wherein the abrasive particles comprise cerium oxide and the reagent comprises nitric acid.

12. The method of claim 10, wherein the abrasive particles comprise silica, silicon, alumina, or tungsten.

13. The method of claim 10, wherein the abrasive particles comprise silica or silicon and the reagent is selected from the group consisting of aqueous KOH, alcoholic KOH, and aqueous TMAH.

14. The method of claim 10, wherein the abrasive particles comprise alumina and the reagent comprises a mixture of methanol, hydrochloric acid, and hydrofluoric acid.

15. The method of claim 10, wherein the abrasive particles comprises a tungsten and the reagent comprises a sodium hypochlorite.

16. The method of claim 10, wherein the abrasive particles comprise an alumina and the reagent comprises a phosphoric acid.

17. A method for in situ reduction in size of abrasive particles in a slurry during a polishing process for planarization of a wafer, comprising:

dispensing a CMP slurry;

planarizing a semiconductor thin film using the slurry;

reducing the slurry dispense;

dispensing a reagent during a polishing process; and rinsing with DI water.

18. The method of claim 17, wherein the application of the reagent is controlled to reduce the size of the abrasive particles.

19. The method of claim 17, wherein the application of the reagent is controlled to reduce the size of agglomerations of the abrasive particles.

20. The method of claim 17, wherein the application of the reagent is controlled to dissolve the abrasive particles.

21. The method of claim 17, wherein the step of dispensing the reagent is for a time sufficient to reduce the size of the abrasive particles.

22. The method of claim 17, wherein the abrasive particles comprise cerium oxide and the reagent comprises nitric acid.

23. The method of claim 17, wherein the abrasive particles comprise silica, silicon, alumina, or tungsten.

24. The method of claim 17, wherein the abrasive particles comprise silica or silicon and the reagent is selected from the group consisting of aqueous KOH, alcoholic KOH, and aqueous TMAH.

25. The method of claim 17, wherein the abrasive particles comprise alumina and the reagent comprises a mixture of methanol, hydrochloric acid, and hydrofluoric acid.

26. The method of claim 17, wherein the abrasive particles comprise tungsten and the reagent comprises a sodium hypochlorite.

27. The method of claim 17, wherein the abrasive particles comprise alumina and the reagent comprises a phosphoric acid.

* * * * *